(12) United States Patent
Michel et al.

(10) Patent No.: US 7,113,936 B1
(45) Date of Patent: Sep. 26, 2006

(54) OPTIMIZER IMPROVED STATISTICS COLLECTION

(75) Inventors: Ruben Michel, Hopkinton, MA (US); Ron Arnan, Brookline, MA (US); David DesRoches, Methuen, MA (US); Victoria Dubrovsky, Westboro, MA (US)

(73) Assignee: EMC Corporation, Hopkinton, MA (US)

( * ) Notice: Subject to any disclaimer, the term of this patent is extended or adjusted under 35 U.S.C. 154(b) by 476 days.

(21) Appl. No.: 10/013,184

(22) Filed: Dec. 6, 2001

(51) Int. Cl.
*G06F 17/30* (2006.01)
*G06F 17/00* (2006.01)
*G06F 13/12* (2006.01)

(52) U.S. Cl. .............. 707/2; 707/7; 707/100
(58) Field of Classification Search ............ 707/2, 707/3, 100, 7; 710/8, 19; 360/69; 370/241, 370/252
See application file for complete search history.

(56) References Cited

U.S. PATENT DOCUMENTS

| | | | |
|---|---|---|---|
| 5,381,539 A | 1/1995 | Yanai et al. | 711/133 |
| 5,592,432 A | 1/1997 | Vishlitzky et al. | 365/230.03 |
| 5,758,146 A * | 5/1998 | Schiefer et al. | 707/2 |
| 5,819,310 A | 10/1998 | Vishlitzky et al. | 711/114 |
| 5,890,014 A * | 3/1999 | Long | 710/8 |
| 6,223,171 B1 * | 4/2001 | Chaudhuri et al. | 707/2 |
| 6,591,269 B1 * | 7/2003 | Ponnekanti | 707/100 |

OTHER PUBLICATIONS

Smalley, Eric, "Frye adds history module to node monitor" (Frye Computer System Inc's Node Tracker 2.0 network management software) (Brief Article) (Product Announcement); Oct. 31, 1994; PC Week, v11, n43, p73(1).*

Sanna et al., "ProQuest Information and Learning—Special Edition Using Windows NT Workstation 4.0"; Aug. 22, 1997; Que; ISBN 0-7897-1384-5, pp. 1-16.*

Mellish et al., "ProQuest Information and Learning—Fibre Array Storage Technology A FAStT Introduction"; May 31, 2001; IBM; ISBN 0-7384-2167-7; pp. 1, 12-21.*

"VERITAS Volume Manager 2.7 for Windows 2000—User's Guide"; Jun. 2001; VERITAS; "Performance Tuning"; pp. 145-156.*

Paul Cassel; "Microsoft Windows 2000 Professional Unleashed"; Feb. 14, 2000; Sams Publishing; Chapter 28, Performance Monitor; ISBN: 0-672-31742-7.*

Wyke et al.; "PHP Developer's Dictionary"; Dec. 13, 2000; Sams; ISBN: 0-672-32029-0.*

* cited by examiner

*Primary Examiner*—John Breene
*Assistant Examiner*—Gwen Liang
(74) *Attorney, Agent, or Firm*—Muirhead & Saturnelli, LLC

(57) ABSTRACT

Described are techniques for performing compression and decompression of statistical data. This data may be used in connection with performing optimizations. A delta value for each statistic is determined representing a difference between a current value and a previous value. Delta values are stored in a statistics table in a compressed form using a monotonic compression scheme. Small tables are used to determine decompressed values estimating the observed values. Statistical information is stored and represented in a statistics table and an events table. Statistical information is selectively fetched and loaded into memory from a storage device. Indexing techniques are used to force physical continuity of the rows of the statistics table on a storage device in accordance with a specified retrieval order.

41 Claims, 12 Drawing Sheets

OPTIMIZER IMPROVED STATISTICS COLLECTION

BACKGROUND

1. Technical Field

This invention generally relates to computer systems, and more particularly to techniques for data storage.

2. Description of Related Art

Computer systems may include different resources that may be used by one or more host processors. Resources and host processors in a computer system may be interconnected by one or more communication connections. These resources may include, for example, data storage devices such as the Symmetrix™ family of data storage systems manufactured by EMC Corporation. These data storage systems may be coupled to one or more host processors and provide storage services to each host processor. An example data storage system may include one or more data storage devices, such as those of the Symmetrix™ family, that are connected together and may be used to provide common data storage for one or more host processors in a computer system. An example of operation and management of a data storage system is the Symmetrix data storage system as described in U.S. Pat. No. 5,819,310, Vishlitzky et al., entitled "Method and Apparatus for Reading Data from Mirrored Logical Volumes on Physical Drives", issued Oct. 6, 1998, which is herein incorporated by reference, U.S. Pat. No. 5,592,432, entitled "Cache Management System Using Time Stamping for Replacement Queue", issued Jan. 7, 1997, Vishlitzky et al., which is herein incorporated by reference, and U.S. Pat. No. 5,381,539, issued on Jan. 10, 1995, entitled "System and Method for Dynamically Controlling Cache Management", Yanai et al., which is herein incorporated by reference, all of which are assigned to EMC Corporation of Hopkinton, Mass.

There may be a need within a computer system to collect statistics and other data. For example, in connection with performing data operations within a data storage system, an optimizer may be used to perform certain optimizations, such as those in connection with increasing disk performance of devices with the data storage system. Such optimizations may include, for example, performing logical device swapping. Data collection of statistics, such as measurements related to device performance, may be obtained and utilized by the optimizer. For example, statistics may be gathered regarding data storage operations, such as read and write operations, for devices in a data storage system.

The amount of data in the form of statistics collected over a predetermined time period may be a large amount, for example, in systems that have a large number of physical and/or logical devices. The amount of data may increase as the number of devices increases.

Efficient techniques may be used in connection with storage of the statistics, such as those used by the optimizer since there may be a large amount of data. Additionally, the optimizer may be invoked frequently to perform optimization determinations using these statistics. Thus, efficient retrieval techniques may also be used in connection with accessing the statistics.

One technique may store all the statistics in virtual memory. This may provide the advantage of ease of implementation. Additionally, the memory management may be performed by the underlying operating system, for example, in connection with memory page swapping operations used with virtual memory management systems. However, this technique of storing all the statistics in memory may exceed the amount of virtual memory as the amount of statistics collected increases. Additionally, as the amount of statistics increases, relying on the virtual memory management techniques of a system may result in performance decreases due to the large amount of page swapping that may occur as data is accessed for use by the optimizer. The physical ordering of data may not match the logical ordering of requested data.

Thus, it may be desirous to have an efficient technique for use in storing large amounts of data, such as statistics, and additionally utilizing efficient retrieval techniques as the data may have to be accessed frequently that overcomes the disadvantages of prior techniques.

SUMMARY OF THE INVENTION

In accordance with principles of the invention is a method executed in a computer system for storing statistics. Statistics are collected in connection with performing an operation in the computer system. The statistics are stored in a statistics table. At least one device is determined having corresponding statistics in the statistics table in which statistics related to the at least one device are currently being used in processing. Only a portion of data from the statistics table is loaded into memory in accordance with the at least one device.

In accordance with another aspect of the invention is a computer program product for performing an operation in a computer system that includes machine executable code for: collecting statistics in connection with performing an operation in the computer system; storing said statistics in a statistics table; determining at least one device having corresponding statistics in said statistics table in which statistics related to said at least one device are currently being used in processing; and loading into memory only a portion of data from said statistics table in accordance with said at least one device.

In accordance with yet another aspect of the invention is a computer system that includes a data storage system, a data collector, a database, an optimizer, and a memory. The data collector collects statistics about the data storage system. The database includes the statistics. The optimizer performs optimizations in accordance with the statistics. In the memory, a selective portion of the statistics are loaded in accordance with a current operation being performed by the optimizer.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF PREFERRED EMBODIMENT

Figure 1:
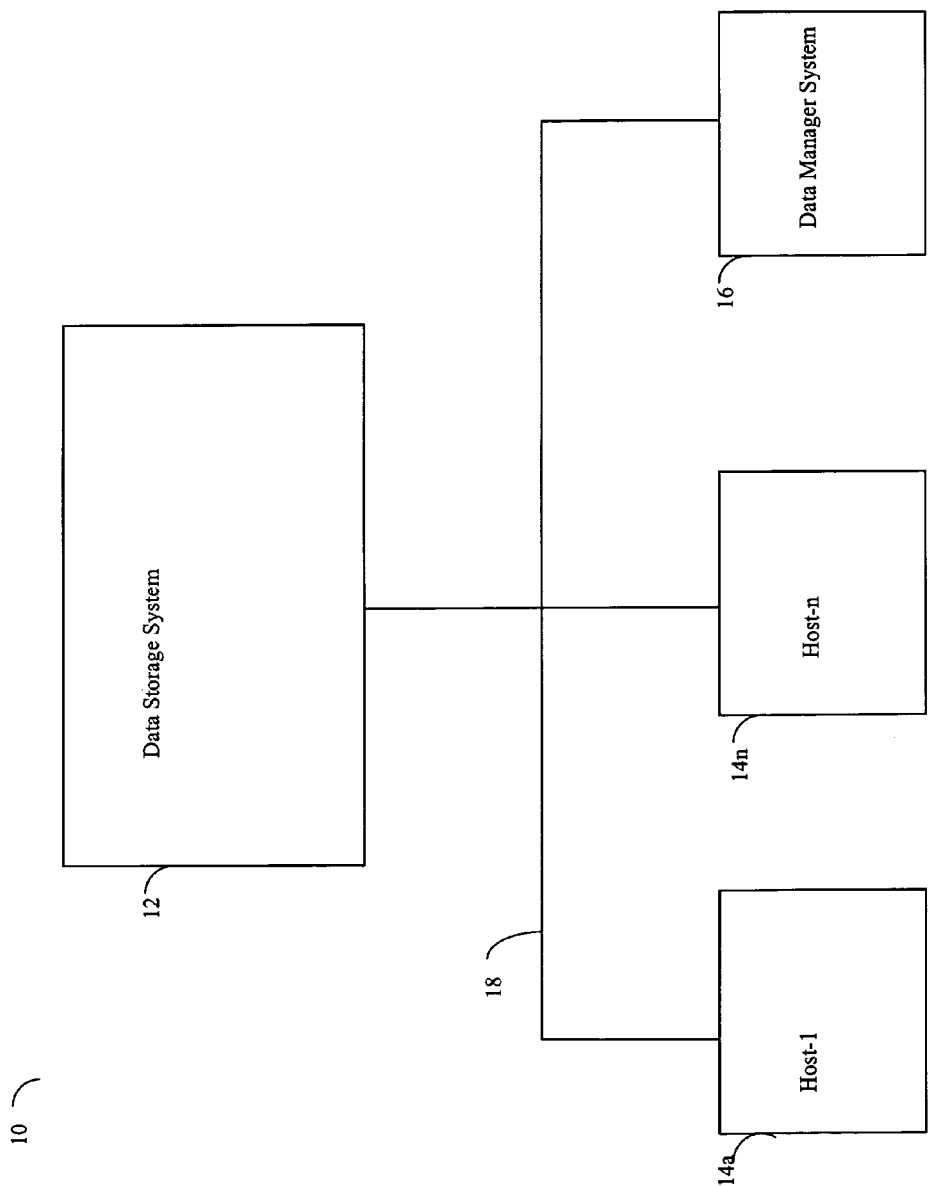
FIG. 1 is an example of an embodiment of a computer system according to the present invention.

Referring now to FIG. 1, shown is an example of an embodiment of a computer system according to the present invention. The computer system 10 includes a data storage system 12 connected to host systems 14a–14n, and a data manager system 16 through communication medium 18. In this embodiment of the computer system 10, the N hosts 14a–14n and the data manager system 16 may access the data storage system 12, for example, in performing input/output (I/O) operations or data requests. The communication medium 18 may be any one of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network or other connection(s) by which the host systems 14a–14n, and the data manager system may access and communicate with the data storage system 12, and may also communicate with others included in the computer system 10.

Each of the host systems 14a–14n, the data manager system 16, and the data storage system 12 included in the computer system 10 may be connected to the communication medium 18 by any one of a variety of connections as may be provided and supported in accordance with the type of communication medium 18. The processors included in the host computer systems 14a–14n and the data manager system 16 may be any one of a variety of commercially available single or multi-processor system, such as an Intel-based processor, IBM mainframe or other type of commercially available processor able to support incoming traffic in accordance with each particular embodiment and application.

It should be noted that the particulars of the hardware and software included in each of the host systems 14a–14n and the data manager system 16, as well as those components that may be included in the data storage system 12 are described herein in more detail, and may vary with each particular embodiment. Each of the host computers 14a–14n, as well as the data manager system 16, may all be located at the same physical site, or, alternatively, may also be located in different physical locations. Examples of the communication medium that may be used to provide the different types of connections between the host computer systems, the data manager system, and the data storage system of the computer system 10 may use a variety of different communication protocols such as SCSI, ESCON, Fibre Channel, or GIGE (Gigabit Ethernet), and the like. Some or all of the connections by which the hosts, data manager system 16 and data storage system 12 may be connected to the communication medium 18 may pass through other communication devices, such as a Connectrix™ switch or other switching equipment that may exist such as a phone line, a repeater, a multiplexer or even a satellite.

Each of the host computer systems as well as the data manager system may perform different types of data operations in accordance with different types of administrative tasks. In the embodiment of FIG. 1, any one of the host computers 14a–14n may issue a data request to the data storage system 12 to perform a data operation. For example, an application executing on one of the host computers 14a–14n may perform read and/or write operations for the purpose of performing a backup, mirroring or other administrative operation and may do so while performing data requests to the data storage system 12.

It should be noted that the hosts and the data manager system of FIG. 1 may each use a different type of communication connection to communicate to the data storage system.

Figure 2:
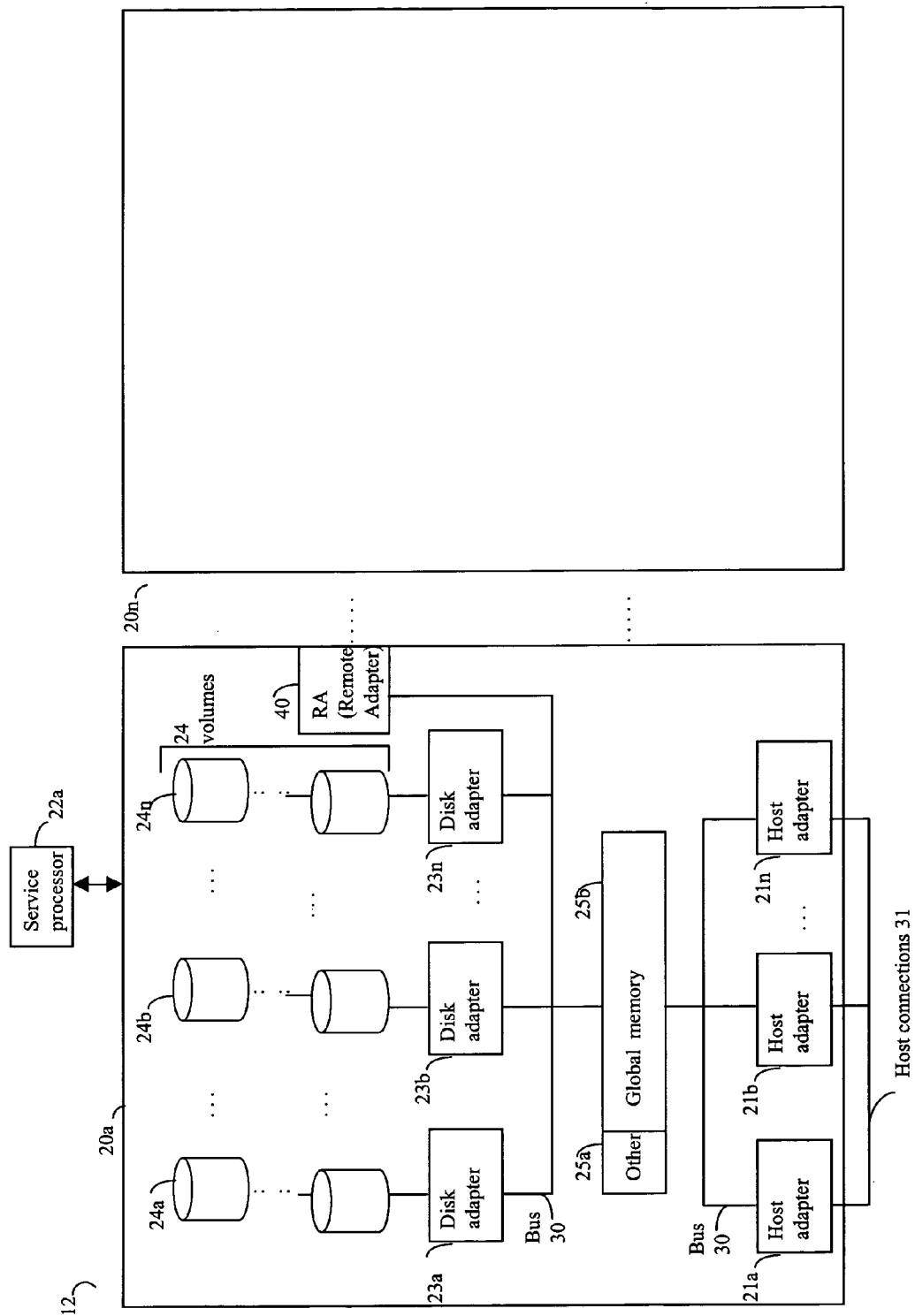
FIG. 2 is an example of an embodiment of a data storage system.

Referring now to FIG. 2, shown is an example of an embodiment of the data storage system 12 that may be included in the computer system 10 of FIG. 1. Included in the data storage system 12 of FIG. 2 are Symmetrix™ storage systems 20a–20n as manufactured by EMC Corporation of Hopkinton, Mass. In this particular example, each of the Symmetrix™ storage systems 20a–20n may be interconnected (not shown) as well as being connected to the host and data manager systems through any one or more communication connections 31 that may vary with each particular embodiment and device in accordance with the different protocols used in a particular embodiment. Additionally, the type of communication connection used may vary with certain system parameters and requirements, such as those related to bandwidth and throughput required in accordance with a rate of I/O requests as may be issued by the host computer systems, for example, to the data storage system 12. In this example as described in more detail in following paragraphs, reference is made to the more detailed view of element 20a. It should be noted that a similar more detailed description may also apply to any one or more of the other elements, such as 20n, but have been omitted for simplicity of explanation. It should also be noted that an embodiment may include other types of data storage systems in combination with one or more Symmetrix™ systems. Each of 20a–20n may be resources included in an embodiment of the computer system 10 to provide storage services to, for example, host computer systems and/or the data manager system. The host connections 31 may be communication connections which are external, internal, or a combination thereof, with respect to a storage system.

Each of the Symmetrix™ systems, such as 20a, may include a plurality of disk devices or volumes, such as the arrangement 24 consisting of n rows of disks or volumes 24a–24n. In this arrangement, each row of disks or volumes may be connected to a disk adapter ("DA") or disk director responsible for the backend management of operations to and from a portion of the disks or volumes 24. In the Symmetrix™ system 20a, a single DA, such as 23a, may be responsible for the management of a row of disks or volumes, such as row 24a. Each of the DAs 23a–23n are connected, for example, by a bus 30 to a cache that includes a particular portion designated as global memory 25b. The DAs 23a–23n may perform data operations to and from the global memory 25b, for example, in communications with other disk adapters or disk directors, and other components of the system 20a. Generally, the global memory 25b may be used in facilitating communications between components in the system 20a.

An embodiment of the Symmetrix™ system 20a may include a service processor 22a used to manage and monitor the system 20a. In one embodiment, the service processor 22a may be used in collecting performance data, for example, regarding the I/O performance in connection with system 20a. This performance data may relate to, for example, performance measurements in connection with a data request as may be made from the different host computer systems 14a–14n. This performance data may be gathered and stored, for example, in the global memory and/or other storage area.

The system 20a may also include one or more host adapters ("HAs") or directors 21a–21n. Each of these HAs may be used to manage communications and data operations between one or more host systems and the global memory.

The particular data storage system as described in this embodiment, such as a Symmetrix™ system by EMC Corporation or a disk, should not be construed as a limitation. Other types of commercially available data storage systems, as well as processors and hardware controlling access to these particular devices, may be also be included in an embodiment.

Also shown in the storage system 20a is an RA or remote adapter 40. The RA may be hardware including a processor used to facilitate communication between data storage systems, such as between two Symmetrix data storage systems. The RA may be used, for example, with the Remote Data Facility (RDF) product provided by EMC Corporation of Hopkinton, Mass., or other remote adapter products as may be supplied by other vendors and distributors.

Host systems provide data and access control information through channels to the storage systems, and the storage systems may also provide data to the host systems also through the channels 31. The host systems do not address the disk drives of the storage systems directly, but rather access to data may be provided to one or more host systems from what the host systems view as a plurality of logical devices or logical volumes (LVs). The LVs may or may not correspond to the actual disk drives. For example, one or more LVs may reside on a single physical disk drive. Data in a single storage system may be accessed by multiple hosts allowing the hosts to share the data residing therein. The HAs may be used in connection with communications between a Symmetrix data storage system and a host system. The RAs may be used in facilitating communications between two Symmetrix data storage systems. The DAs may be used in connection with facilitating communications to the associated disk drive(s) and LV(s) residing thereon.

It should also be noted that embodiment may implement device mirroring such that, for example, a data storage system may include several mirrors of a single LV in which a single physical device may include a plurality of mirrors corresponding each to a different LV. For example, one physical disk may include a mirrored copy for each of several different LVs such as a mirror copy of LV5, a mirror copy of LV9 and a mirror copy of LV2.

The DA may cause I/O operations to be performed on a volume or device. In the following description, data may be accessed by LV in which a single DA manages data requests and related I/O operations for multiple LVs that may reside on a disk.

It should be noted that a service processor 22a associated with a particular Symmetrix data storage system, such as 20a, may exist external to the data storage system 20a (as shown in FIG. 2). The service processor 22a may communicate with the data storage system 20a using any one of a variety of communication connections. In one embodiment, the service processor 22a may communicate with a data storage system, such as 20a, through three different connections, a serial port, a parallel port and using a network interface card, for example, with an Ethernet connection. Using the Ethernet connection, for example, a service processor may communicate directly with DAs and HAs within a Symmetrix system.

Figure 3:
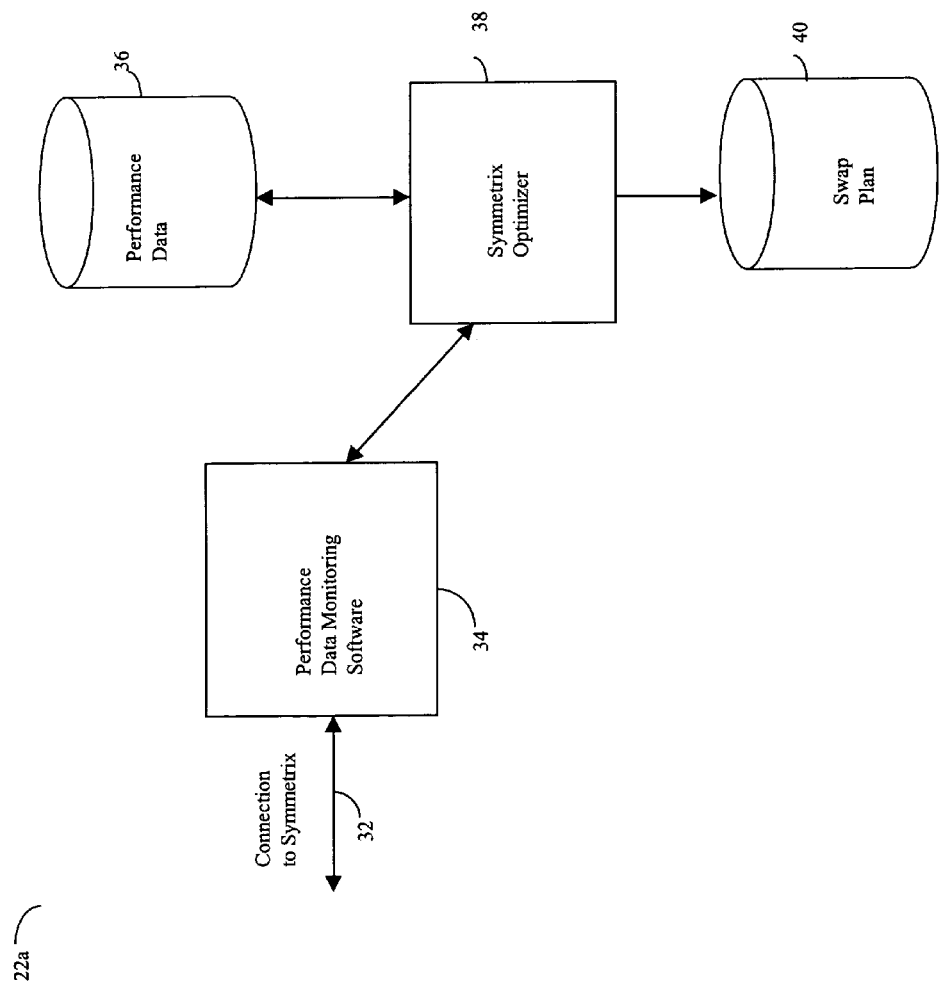
FIG. 3 is an example of an embodiment of software that may be included in a service processor of a data storage system.

Referring now to FIG. 3, shown is an example of software that may be included in a service processor such as 22a. It should be noted that the service processor may be any one of a variety of commercially available processors, such as an Intel-based processor, and the like. Although what is described herein with reference to FIG. 3 shows details of software that may reside in a particular service processor 22a, similar software components may exist in each of the other service processors such as 22n associated with other Symmetrix™ storage systems. In other embodiments, this software may also reside on any of the host systems 14a–14n, or even on the data manager system 16.

Included in the service processor 22a is performance data monitoring software 34 which gathers performance data about the Symmetrix™ system 20a through the connection 32. The performance data monitoring software 34 gathers and stores performance data and forwards this to the Symmetrix optimizer 38 which further stores the data in the performance data file 36. This performance data 36 may also serve as an input to the Symmetrix™ optimizer 38 which attempts to enhance the performance of I/O operations, such as those I/O operations associated with data storage devices 24a–24n and Symmetrix™ system 20a. The Symmetrix™ optimizer 38 may take into consideration various types of parameters and performance data 36 in an attempt to optimize particular metrics associated with performance of the Symmetrix™ system 20a. These may include, for example, seek time, service time, response time, and the like. For example, the Symmetrix™ optimizer 38 may attempt to decrease the response time associated with I/O requests. It may use the performance data 36 in performing optimizations, for example, such as to produce as an output swap plan 40. The swap plan 40 may include, for example, a description of which LVs or particular mirrored copies of an LV on a particular data storage device such as 24a may be swap candidates.

Each of the data storage devices 24a–24n may be physical devices, such as disks, and may be organized and segmented into one or more LVs. Particular I/O requests may be associated with particular LVs.

It should also be noted that an embodiment of the Symmetrix™ optimizer may reside completely upon, and be executed solely upon, a service processor of one or more Symmetrix™ systems collecting data using, for example, the global memory. An embodiment may also include an optimizer that resides, and is executed, on any one or more processors in a Symmetrix™ system and/or host computer and/or other processor of the computer system 10.

What will now be described are techniques that may be used in connection with storing data, for example, as may be used in connection with statistics collected for use by the optimizer within a data storage system. The optimizer may access the data, for example, statistics collected within a plurality of LVs when performing a data storage optimization. Although the description in following paragraphs relates to data storage systems and statistics collected for use by an optimizer, the techniques described herein may also be used in connection with collecting other statistics for use in connection with other types of analysis, display, and the like with other hardware and/or software and related operations as known to those of ordinary skill in the art.

An embodiment may store the statistics collected in a database, such as the MSDE 2000 database available from Microsoft Corporation of Redmond Wash. The MSDE 2000 database as described herein is an SQL database. Other data containers may be used to manage and store collected statistics and may vary in accordance with, for example, performance and storage requirements of each particular embodiment.

In connection with statistics collected, for example, such as those of data operations of a data storage system, delta values or differences may be stored rather than raw counter values. For example, a delta value or difference may represent the amount of increase or decrease relative to a previous value. This may result in a decrease in the amount of storage requirements as the upper bound on the size of possible delta values may be less than the that of the raw counter values. Further, an embodiment may also utilize data compression techniques for the delta values that may further decrease the amount of storage required for storing the collected statistics. Particular techniques that maybe used in connection with compressing these delta values or other data are described elsewhere herein in more detail.

In one embodiment, a counter may be used in counting and tracking different statistics. The counter may be a value that always increases unless it is reset to some starting quantity. A delta at a time "n" may represent the difference between the same counter at a previous time "n−1" and a current time "n". An anchor or starting value may be stored and used in determining the first delta value.

As described herein, Xobs may represent the value of a statistic as recorded or observed, Cx may represent the compressed value of Xobs, and Xdec may represent the value Cx after a decompression technique has been applied to the value Cx. In this manner, Xdec represents an estimate of the value of Xobs. If there is no error in the compression and decompression process of the value of Xobs, the value of Xobs=Xdec. Thus, the amount of error introduced by the compression may be represented as |Xobs−Xdec|. This value may be represented in a normalized form as:

$$\frac{|Xobs - Xdec|}{Xobs} \quad \text{EQUATION 1}$$

An embodiment may also define an acceptable or threshold error, $\epsilon$, as an upper bound for the error. Thus, $$\frac{|Xobs - Xdec|}{Xobs} \leq \epsilon \quad \text{EQUATION 2}$$

An embodiment may place certain requirements on the values as produced by the compression technique. One embodiment may require that the compressed values produced be monotonically increasing such that the ordering of Xobs values is preserved by the application of the compression function when comparing Cx values as output by the compression function.

This may be represented as:

$$\text{if } Xobs1 \leq Xobs2, \text{ then } Cx1 \leq Cx2 \quad \text{EQUATION 3}$$

where Xobs1 and Xobs2 represent observed statistics and Cx1 and Cx2, respectively, are the corresponding output values of a compression function. If the foregoing property holds for a given compression function, then data querying techniques, comparisons and the like may be used in connection with the compressed values as if being performed on the corresponding observed values, Xobs.

The selection of the size of the compressed value may vary in accordance with an embodiment. In one embodiment, the size of the compressed delta value is one byte. However, the size of the compressed value may be selected in accordance with the particular range of values produced by the compression technique used and may also vary in accordance with the range of delta values. The particular compression technique and size of the compressed output values may produce a unique value for each particular input.

It should be noted that in a data storage system, as the number of LVs increases, the average amount of activity of each LV may decrease. In other words, for a given activity level, as the number of LVs increases, the average amount that may be associated with a particular LV may decrease. This may hold for the total LVs in the system as well as the number of LVs associated with a particular device, such as a disk. In one embodiment, the number of LVs associated with a disk may be, for example, 128 LVs.

It should be noted that the size of the decompressed values may vary in accordance with each embodiment. In particular, it may vary in accordance with the size of the domain of decompressed values, as well as the accuracy or acceptable error described elsewhere herein in more detail. As described herein, the size of a byte represents the set of compressed data values within an acceptable accuracy.

An embodiment may minimize the relative error associated with small data values. In other words, relative error is considered rather than absolute error regardless of the size of the data value since. For example, the percentage or size of an error relative to the size of the data value is considered since an error of 1 unit, for example, for a data value of 2 (½) represents a much larger relative error, for example, than when using a larger data value of 10 (⅟10).

The data compression technique used represents the full range of possible delta values. This range may include preservation of large and small delta values within the specified threshold as applied to the normalized values described above.

Any one or more statistics may be gathered in an embodiment in accordance with the calculations performed, for example, in connection with optimizations. Various formulae that may be used in obtaining different calculations, for example, in determining "access time", and other statistics that may be gathered in connection with disk performance are included in U.S. Pat. No. 6,061,761, filed Oct. 6, 1997 to Bachmat which is herein incorporated by reference.

The data collected in one embodiment may be used in connection with determining the load or LV activity within a data storage system that may be represented, for example, as a weighted average of read operations, write operations, and prefetched data.

For a given time interval, for each LV, the Optimizer may calculate activity per second in connection with various I/O requests, for example, as:

$$LV \text{ activity}=(1*\# \text{ of read requests}+0.5*\# \text{ of write requests}++0.25*\# \text{ of prefetched tracks})/(\text{time of interval}) \quad \text{EQUATION 4A}$$

The foregoing EQUATION 4A represents a weighted activity level in which a factor is associated with the different types of I/O requests and accesses included therein. This is called LV activity unit in pending U.S. patent application Ser. No. 09/709,077 filed on Nov. 10, 2000, entitled "Correlation Criteria for Logical Volumes", by Levin Michael et al. which is herein incorporated by reference. In the foregoing equation, the number of read requests corresponds to the number of read-miss accesses. "Prefetched tracks" may refer to the number of sequential read accesses, for example, as may be performed in connection with prefetching more than one portion of data for a request for one portion of data. Other embodiments may include different I/O requests and use different weighting factors. It should be noted that the data used in connection with determining LV activity as may be calculated above may be obtained, for example, from the performance data monitoring software as described elsewhere herein that may be included in an embodiment of a service processor associated with a Symmetrix™ system.

In connection with EQUATION 4A, an expected load or activity level may be determined.

if X1 R+X2 W+X3 Prefetches≦0, then $$E(\text{LOAD})=E(x1)+E(x2)+E(x3) \quad \text{EQUATION 4B}$$

where E(f) corresponds to the expected value of some value, f, where X1, X2, and X3 are some weighted values or constants, respectively, for each of the number of reads(R), writes(W), and prefetches.

What will now be described relates to estimation of the relative error when a compressed value, Cx, is decompressed producing a value, Xdec. The range of values for a given Xobs as may be used in connection with a decompression function may be represented by the interval [m, M] where "m" represents the minimum value to be compressed and M represents the maximum value to be compressed within each interval. An estimation of the worst relative error for an observed value Xobs may be:

$$(M-Xobs)/M=(Xobs-m)/m \quad \text{EQUATION 5}$$

using the upper bound for relative error as may be determined using EQUATION 1 described elsewhere herein for each of the minimum, m, and maximum, M, values of the interval. In other words, there may be an assumption that the maximum upper bound of the relative errors are the same since they are both in normalized form.

EQUATION 5 above may be expanded and further represented algebraically as:

$$m(M-Xobs)=M(Xobs-m)$$

$$mM-mXobs=M Xobs-Mm$$

$$Xobs=2Mm/(m+M)=2/((1/M)+(1/m)) \quad \text{EQUATION 6A}$$

$$= H(m, M) \quad \text{EQUATION 6B}$$

where "H(m,M)" represents the harmonic average of the two values, M and m as shown above.

Given a particular lower bound, m, an acceptable error or error threshold, $\epsilon$ an upper bound, M, may be determined:

$$\epsilon \geq \frac{M - \frac{2mM}{m+M}}{M} \quad \text{EQUATION 7}$$

$$\epsilon \geq 1 - \frac{2m}{m+M} = \frac{M-m}{m+M}$$

and solving for "M":

$$\epsilon M + \epsilon m \geq M - m$$

$$m((1+\epsilon)/(1-\epsilon)) \geq M$$

Thus, EQUATION 7 represents the upper bound M in terms of the lower bound m for a given range of possible values, [m,M] for a given Xobs.

It should be noted that particular values for m and M may vary in accordance with the size of the interval selected for a particular maximum value of Xobs being compressed.

Figure 4:
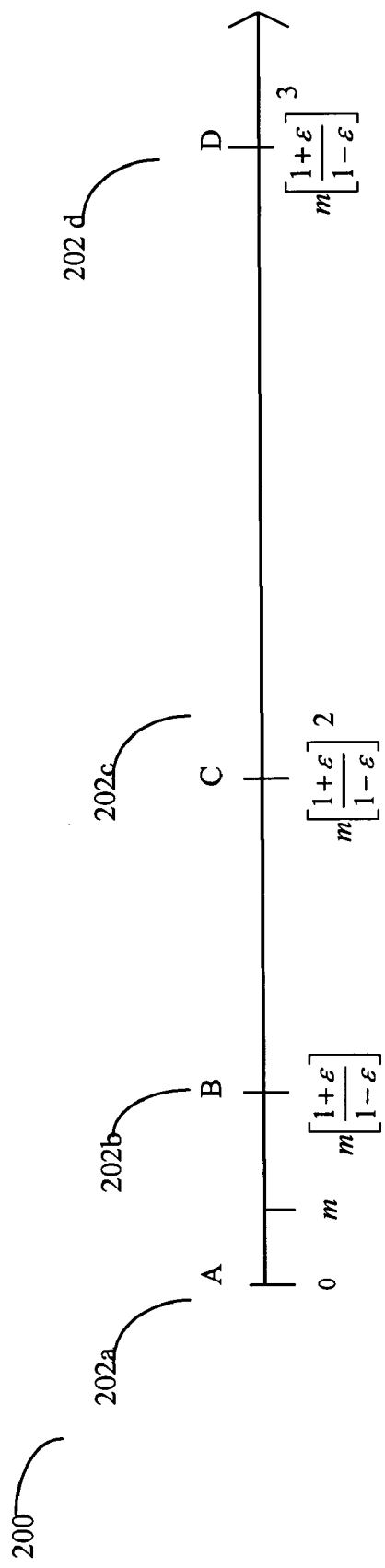
FIG. 4 is an example of a graphical illustration of the range of decompressed output values for a given set of intervals.

Referring now to FIG. 4 shown is an example of a graphical representation of the range of input values Xobs. The range of the Xobs values to which a compression function may be applied is expressed in terms of bounds m and M for each interval. The range of corresponding possible input values for Xobs over all the intervals may be represented as [0,Maximum] where Maximum is the maximum possible delta value. In one embodiment, the value of Maximum representing the maximum possible delta value is 1,000,000. Other embodiments may utilize other values. For Xobs values, in this example, that are below some small value S, the encoding of Xobs is Xobs itself, for example, as the error introduced by compression may be unnecessary as the values of Xobs may be sufficiently small. Values for Xobs that are at least of size "m" may have a corresponding decompressed value Xdec within some acceptable error threshold.

The representation 200 includes marked off intervals of the same length demonstrating how a particular input value Xobs may be mapped to a particular multiple of M where M is bounded in terms of m as expressed in EQUATION 7. Each interval, as indicated by a letter value recorded above the x-axis of 200, is of a size M. For example, the first interval has an upper bound of M as denoted by 202a, A. The upper bound of the second interval is denoted by 202b, B, and so on. These values may be compressed to fit into a byte location of the range $[0,2^8)$. Thus, the upper bound on the range of relative error for decompressed values may be represented as:

$$((1+\epsilon)/(1-\epsilon))^n \leq \text{Maximum} \quad \text{EQUATION 7.1}$$

where, in this instance, $n=2^8$, and the Maximum Xobs is 1,000,000.

To relate "m" for a given interval having bounds [m, M) and an associated $\epsilon$ value (error threshold) just described as set forth in relation to FIG. 4, "a" may be defined such that:

$$a=((1+\epsilon)/(1-\epsilon)), m=a^k, \text{ for } k=0, 1, 2, \ldots, n-1,$$

where k is some positive integer greater than or equal to zero. The maximum value for k is "n−1", which, in this example, is 255 and may be determined in accordance with the maximum size of the encoded or compressed value range which, in this example, is one byte.

Different values for $\epsilon$ may be used in an embodiment. In one embodiment, a first value for $\epsilon$ of 0.026976 may be used in connection with the maximum interval of 1,000,000 for delta values used in with the read, write and prefetch values of EQUATION 4A. An embodiment may use a different value for $\epsilon$ of 0.0359 in connection with an interval of Xobs values of (0, 100,000,000] for delta values used in a statistics recording the number of blocks read and written.

In the foregoing, different error threshold values, values for $\epsilon$, may be used in accordance with a different corresponding maximum Xobs values.

Given the foregoing, a given input delta value, Xobs, a corresponding compressed or encoded value, Xc, may be determined as a logarithmic representation as:

$$Xc = \lfloor \log_a(Xobs) \rfloor \qquad \text{EQUATION 8}$$

for a=(1+$\epsilon$/1-$\epsilon$), as define above. It should be noted that the above notation "$\lfloor \; \rfloor$" represents the mathematical floor function which may be characterized as always "rounding down" to a value.

The decompressed value, Xdec, for a given Xobs having a corresponding encoded value Xc may be represented as:

$$H(a^k, a^{k+1}) = \frac{2a^k a^{k+1}}{a^k + a^{k+1}} = \frac{2a^{k+1}}{1+a}$$

where k=Xc, for values of k>than a predetermined threshold, as described elsewhere herein.

Thus, a compressed value Xc, may be determined for a given Xobs using EQUATION 8. A decompressed or decoded value, Xdec, for Xc may be determined using a table of values wherein the decompressed value Xdec estimates the original Xobs within a predefined error.

Figure 5:
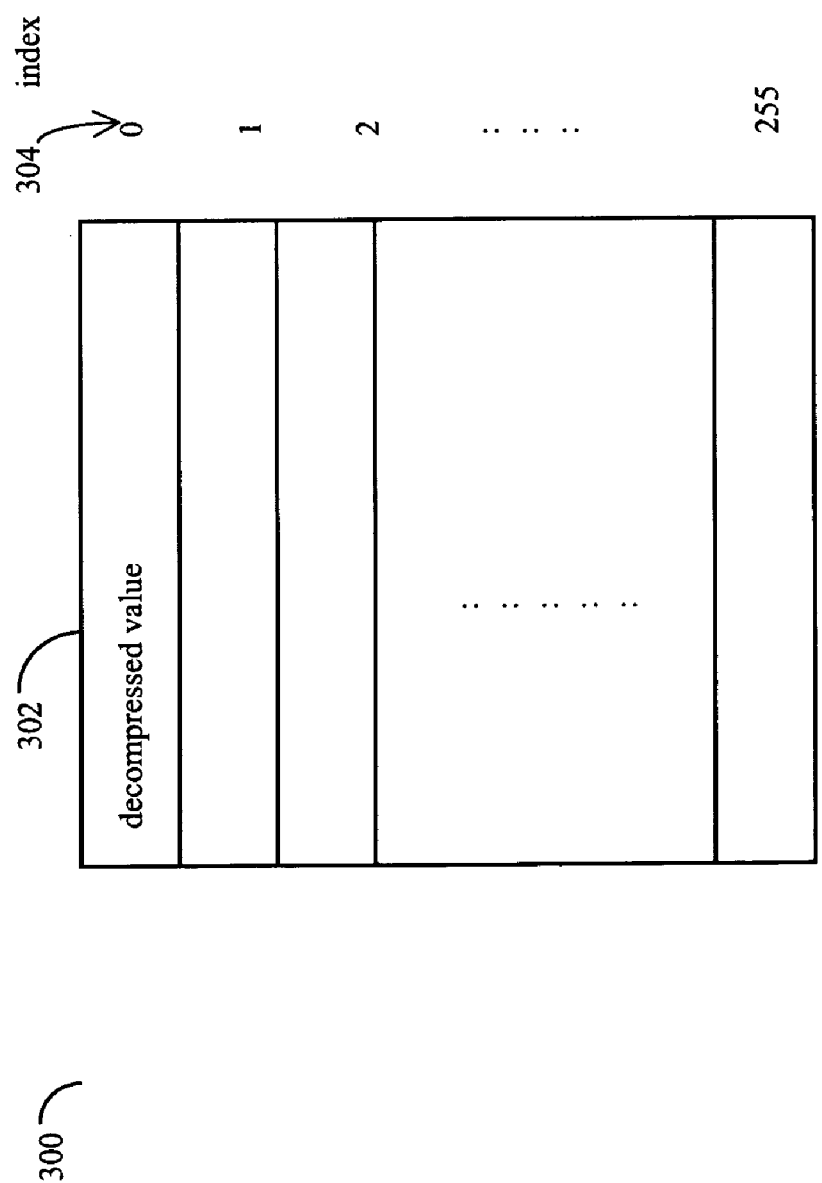
FIG. 5 is an example of an embodiment of a decompressed value table.

Referring now to FIG. 5, shown is an example of an embodiment of a table 300 of decompressed values. A decompressed value, Xdec, may be determined for a given compressed value Xc by using Xc as an index into the table. For each index 304, a stored decompressed value 302 may be retrieved. The decompressed values 302 may be predetermined and stored prior to use, for example, at initialization time. The decompressed values 302 may also be stored in the database, for example, to support viewing decompressed values of the statistics table in the logical view described elsewhere herein. In other words, the decompressed values 302 may be stored in two places, one within the optimizer internally for its own uses and within the database for uses other than by the optimizer, for example, in connection with a viewing operation of the statistics table information.

In the foregoing, the amount of time to determine a decompressed value is the amount of time for looking up a value in the table. Additionally, since the raw value Xc is used as an index in determining a decompressed value, the technique for determining a decompressed value is computationally efficient. An embodiment may determine a decompressed value by forming an address of an element in the table 300 using Xc. Using a pointer, for example, as the base address of the table, an offset may be determined using the value Xc. A particular element's address may be determined, for example, as:

base address of the table+offset, where "offset" may be determined using Xc. In this example, the size of the table 300 is 1K bytes of memory presenting an insignificant storage overhead. Other embodiments may have different sizes for the table.

As described elsewhere herein, a threshold value, "S", may be determined such that values for Xobs which are below this threshold value S are not encoded or compressed using the foregoing techniques. Rather, for values of Xobs less than S, an embodiment may use the value of Xobs as the encoded or compressed value returned, for example, by a routine or function that computes and returns a compressed value Xc for a given Xobs. In one embodiment, encoding or compression of a value Xobs is not performed if the compressed value of Xobs is greater than or equal to the value of Xobs. In this instance, Xc is S, the threshold. This may be represented as:

Xc=compress(Xobs);

if Xobs>=Xc then Xc=Xobs

Other embodiments may use different threshold values.

In one embodiment, the table 300 and other tables may be stored in the database. Other tables that may be stored include, for example, a statistics table and an events table that are described in more detail in following paragraphs.

Figure 6A:
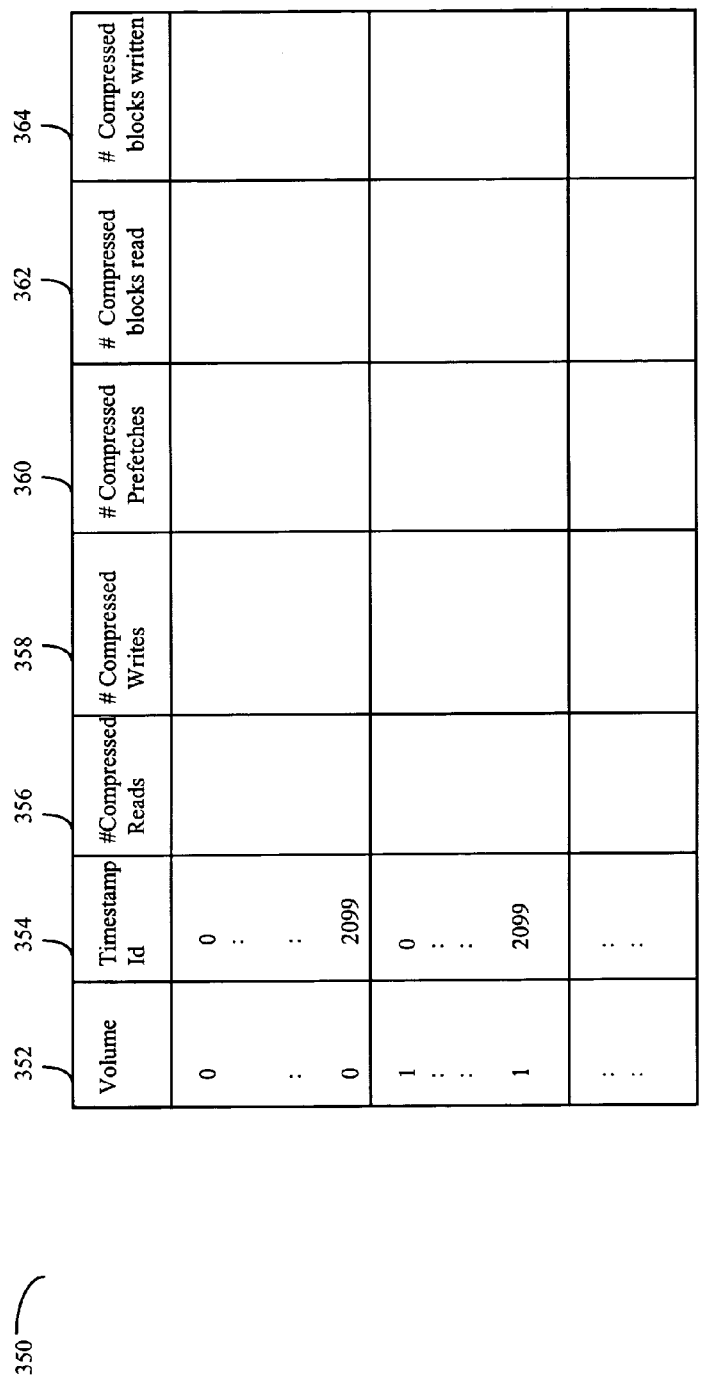
FIG. 6A is an example of an embodiment of a statistics table.

Referring now to FIG. 6A, shown is an example of an embodiment of a statistics table 350. The statistics table 350 may include a column 352 of volumes numbers representing a particular disk volume for which statistics are being stored in the table 350. The timestamp id 354 is a value indicating a time at which the corresponding statistics of columns 356, 358, 360, 362 and 364 are obtained and recorded. The values in columns 356, 358, 360, 362 and 364 may be the compressed delta values of the different statistics for each particular instance identified by the timestamp id value in column 354. Column 356 includes compressed values for the number of read operations, column 358 includes compressed values for the number of write operations, column 360 includes compressed values for the number of prefetch operations, column 362 includes compressed values for the number blocks read and column 364 includes compressed values for the number of blocks written. These compressed values may be the compressed delta values produced using compression or encoding techniques described herein. In this embodiment, each compressed value may be one byte in size. Each entry for the timestamp id may be an unsigned short integer. These values may be decompressed using the decompression techniques described elsewhere herein using table 300 with the compressed delta values used as an index into the table 300.

The timestamp id 354 may be characterized as an identifier corresponding to a data acquisition at a particular time. A timestamp id may be an integer quantity within a range, for example, 0–2099. Additional information about each particular timestamp id may be found in this example in the events table described in more detail elsewhere herein.

Figure 6B:
FIG. 6B is an example of a logical view of the table of FIG. 6A.

An embodiment may include a stored data format of compressed values. When it is desirable to obtain particular statistics in the uncompressed form, for example, such as to display or view statistical data, or for the optimizer to use such statistics in performing an optimization, the physical representation of the compressed data may be transformed into a logical view of the actual statistics using the estimated decompression values. In other words, the physical view of the table, such as included in FIG. 6A, is one that may include the compressed delta values having a logical view corresponding to a table, such as included in FIG. 6B, that includes the decompressed values as set forth in FIG. 5, for example. The physical data format may be converted to another format when used, such as that of FIG. 6B, for example, when viewing the data. The logical view of FIG. 6B may be formed by joining the physical view of FIG. 6A with the decompressed values of FIG. 5. As described herein, this embodiment uses particular SQL support and functionality in forming the logical view of data, for example, as shown in FIG. 6B. However, other embodiments may employ other techniques used in connection with the functionalities provided by hardware and/or software that may vary in accordance with each embodiment.

In addition to the statistics table 350, an embodiment may also include an events table 400 that may also be stored in the database.

Figure 7:
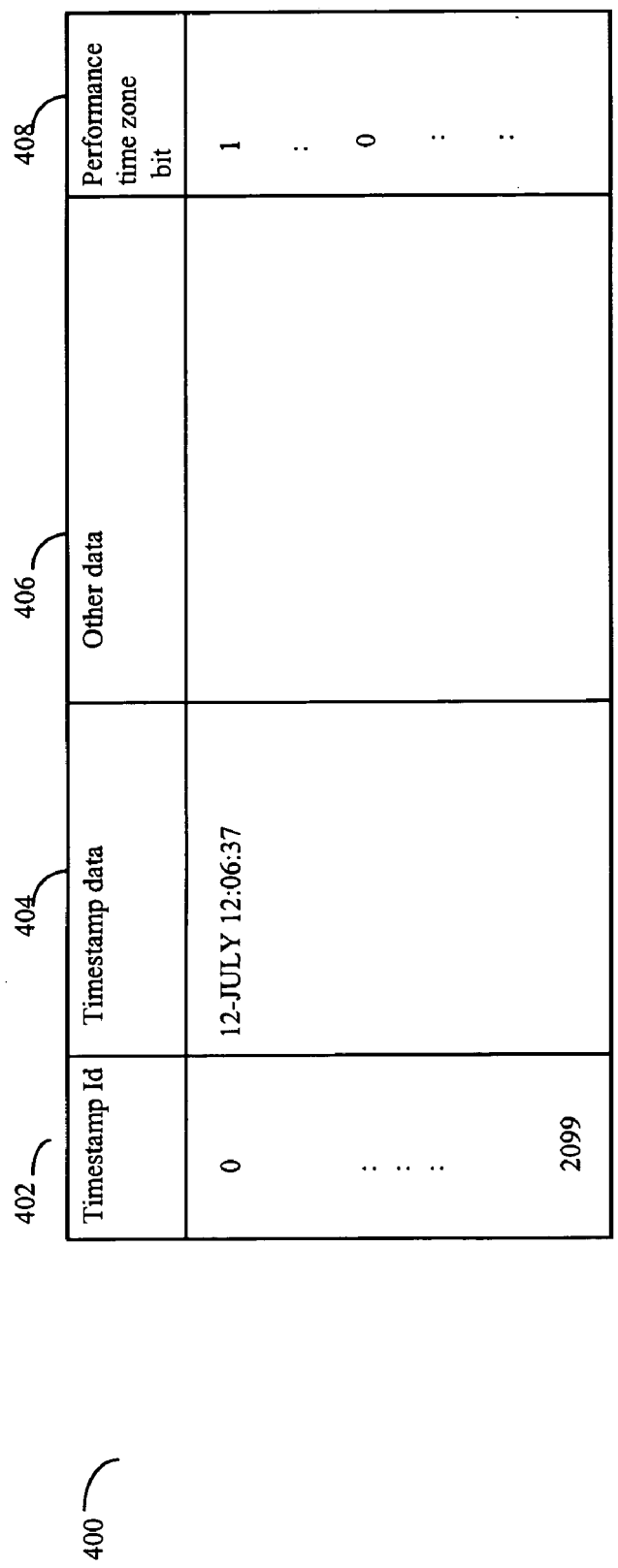
FIG. 7 is an example of an embodiment of an events table.

Referring now to FIG. 7, shown is an example of an embodiment of an events table 400. The events table 400 may include additional information about each particular timestamp for which statistics have been gathered. This table may be used in connection with table 350 to provide additional information in connection with a particular data acquisition as represented by a corresponding timestamp id.

This embodiment of the events table 400 may include a timestamp id column 402 used as index into the events table. These values correspond to values that may be included in the statistics table, such as in column 354. The details of each particular timestamp id, such as a corresponding date and time information 404, may also be included in the table 400. Column 406 may include other information, for example, about the duration of the sample time lapsed between two particular sample collections, the type of sample, and the like.

Column 408 may include a bit quantity have a value of 0 or 1 corresponding to the performance time zone bit. In this embodiment, the performance time zone bit value in Column 408 may be used to indicate which statistics are of interest. In other words, data may be gathered at predetermined time intervals but, for example, only a select portion may be of interest such as only data gathered between certain hours of operations. A bit value of 1 may be used to indicate which statistics are of interest, for example, in connection with performing optimizations. Otherwise, this field may have a value of 0.

Statistical information and corresponding additional event information may be organized into the foregoing two tables 350 and 400. An embodiment may divide the data in a manner and organization similar to what is described herein or select some other variation of data organization. Using the embodiment herein, the events table and the statistics table may be joined using the timestamp identifier. This embodiment uses a time stamp id of 2 bytes and the size of a time stamp is 8 bytes. The particular size limitations associated with the particular time stamp id may be determined in accordance with storage considerations of the tables, as well as the values being represented, such as the size of the timestamp itself being represented by the timestamp id. An embodiment may also combine the data into a single table or other structure rather than have two as described herein.

Other embodiments may include different information, organizations and sizes in accordance with particulars of each embodiment. Additionally, it should be noted that the particulars described herein, such as the use of a specific database, specific amounts and sizes, and the like, may vary in accordance with each embodiment and are described herein for the purposes of example. The techniques and principles described herein may also be applied and used with other variations as known to those of ordinary skill in the art.

One use of the statistics as may be stored in the table 350 is in connection with performing calculations for optimizations. An embodiment using the statistics table 350 in performing optimizations may use any one or more of a variety of techniques in selectively including and loading only particular portions of the statistics into memory. This may be of particular importance in embodiments as the amount of statistics increases, for example, with a large number of devices. An embodiment may selectively load statistics into memory that are used in connection with optimizations. In one embodiment, the statistics for the current "free" disk and current "busy" disk may be loaded into memory. As a new "free" and "busy" disk are determined, the statistics in memory are accordingly updated. In other words, an embodiment may fetch and load into memory only data for LVs on these two disks. This may result in only performing memory management operations for these two disks. Additionally, only those LVs having a performance time zone bit of 1 are loaded in this particular example because, as described elsewhere herein, this field is used to indicate a portion of statistics of interest.

It should be noted that in this embodiment, the optimizer computes access time for each disk. Accordingly, the busiest disk or disk with the highest activity level is determined as well as the disk with the least activity level. Initially, these two disks are, respectively, the busy disk and the free disk. The optimizer in this embodiment may determine current busy and free disks in accordance with other iterations in performing an optimization, for example, as described elsewhere herein in more detail. It should also be noted that an embodiment may include information for more than two particular disks in accordance with performing particular processing steps, for example, with other optimizations.

Techniques may be used in an embodiment to ensure physical ordering within storage of row entries in the statistics table for each volume id or LV. One such technique that may be used in an embodiment is using a clustered index. A particular database, such as one based on SQL, may include functionality for defining a clustered index of one or more fields in a record. A clustered index may be used in connection with performing efficient data accesses given values of attributes indexed. In this example, data from the statistics table may be retrieved for each particular LV number and all timestamp ids associated with the particular LV number having a performance time zone bit value=1. An embodiment may form a clustered index for accessing data in the statistics table using the LV or volume number and the timestamp id, such as the data, respectively, in columns 352 and 354 of table 350. The clustered index may be represented as a b-tree or other data structure, for example, where leaf nodes include data rows that are contiguous according to a lexicographical ordering of index attributes, such as LV# and timestamp id.

An embodiment may use these two values, LV# and time stamp ID, in performing a data access, such as using an application programming interface (API) to access statistics data that may be stored within a database. The clustered index may be used in some embodiments to force physical continuity of storing the rows of the statistics table on a storage device according to a logical ordering, such as a lexicographical ordering. Forcing such continuity may result in quicker access times when retrieving data of the statistics table since using a clustered index that includes the LV number may guarantee physical continuity of data for that particular LV. Additionally, a clustered index may also be formed using only the timestamp id for the events table.

As described herein in connection with use of SQL in an embodiment, the data for the statistics table may be organized using a b-tree data structure which is a form of a balanced tree, as known to those of ordinary skill in the art. The leaf nodes include the data sequentially organized such that the physical layout of the data follows a particular lexicographical ordering in accordance with the index attributes of the clustered index. Other embodiments may include other features and functionality employing the techniques described herein providing quick access time along with physical continuity of data in accordance with a predetermined ordering.

Figure 8:
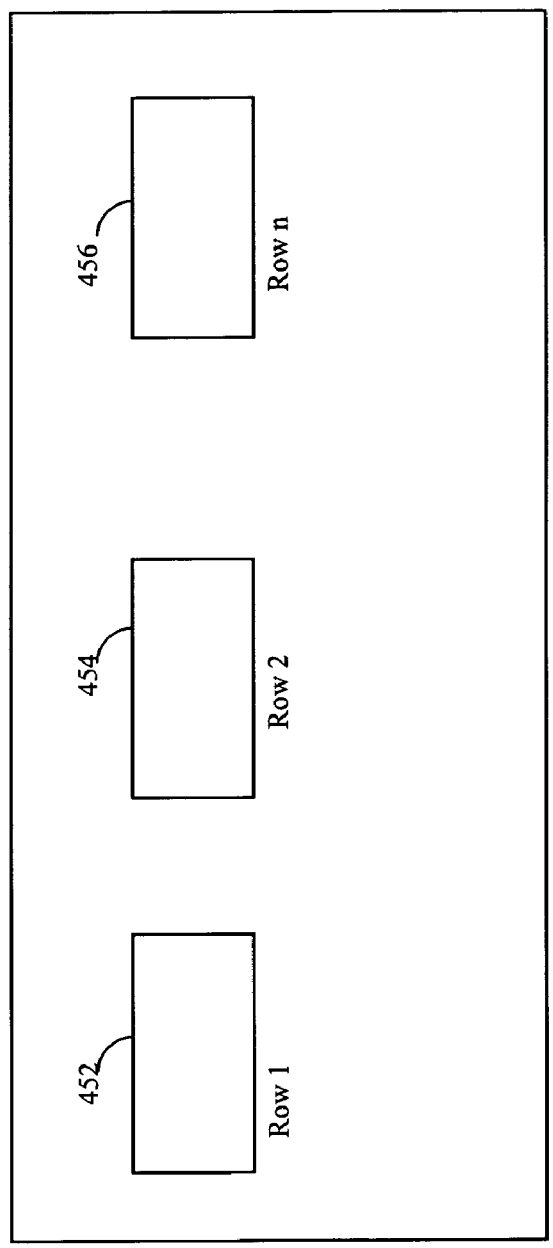
FIG. 8 is an example of an embodiment illustrating rows of data of the statistics table stored on a storage device.

Referring now to FIG. 8, shown is an example of a representation of a logical view of how rows from the statistics table may be stored in a database having a clustered index. A disk page 450 may include the data for a plurality of rows from the statistics table, for example. Use of the clustered index in an implementation may provide a mechanism for storing consecutive rows of the statistics table contiguously. The amount of time to retrieve all rows of the statistics table, for example, for a particular LV may be minimized as all such data may be stored or clustered together with respect to physical location on a device. The performance gains observed may increase as the number of rows of statistics data associated with each LV increases. In one embodiment, each page in the statistics table is 8 K bytes of storage. Accordingly, 8 K bytes of storage may be used to include statistics for logical volumes for a current busy and free disk pair.

In one embodiment using an SQL database for storage of the tables, reading items sequentially causes the database software to perform an optimization which "looks ahead" and performs data pre fetching in connection with a read operation. For example, when performing a sequential read using MSDE, data is prefetched by reading 64 K bytes of data. Other embodiments may similarly performing optimizations, such as prefetching, in connection with a data operation.

It should be noted that the busy disk as may be determined and used, for example, in accordance with criteria specified in connection with performing optimizations, may not change as frequently as the free disk. Accordingly, the free disk statistics may change more frequently than the busy disk and the amount of paging or updating of statistics table in memory may be further reduced. For example, in one embodiment, an optimizer may perform an optimization in which processing steps performed iterate through lists of disks determined as "busy" or active and another list of disks classified as "free" or having a low level of activity. The thresholds associated with each of the "busy" and "free" classifications may vary in accordance with each embodiment. Statistics for each of these disks (free and busy) may be obtained by fetching and loading statistics from the statistics table as needed in performing the processing steps. In general pseudo-code form, the processing steps may embody loop processing as follows:

while not done with all BUSY disks do
curr_BUSY=next BUSY disk in list
while not done with all FREE disks in lists do
: <other processing steps>
:
curr_FREE=next FREE disk in list
end While */free*/
end While /*Busy*/

Using the foregoing techniques in which the current busy and current free disk statistics are selectively loaded for only these two disks, the current busy disk statistics may remain loaded while the current free disk statistics are fetched and updated for multiple free disks. Thus, selective memory management and loading techniques described herein may correspond to behaviors of the optimizer, for example, to increase performance as the statistics are used by the optimizer and to decrease virtual memory usage.

It should be noted that as described herein, an embodiment may use other devices besides a disk, for example, in connection with performing the foregoing busy and free disk classifications in accordance with performance statistics. The techniques described herein as applied to disks may also be applied to other devices as known to those of ordinary skill in the art.

Other embodiments may include other page sizes and table sizes and techniques used in connection with minimizing the number of page accesses to load data from the storage device into memory as needed.

An embodiment may collect statistics at particular time intervals with a particular timestamp id associated with each such collection. The statistics may be gathered and stored in a portion of memory, such as global memory 25b of the storage device in FIG. 2. These statistics may then be stored in the statistics table as additional data is collected.

In one embodiment using clustered indices, the clustered index may be rebuilt after a particular number of insertions in accordance with a given fill factor accommodating the possibility of insertions into the table. An embodiment may specify this fill factor as a particular threshold that may apply, for example, to each page. Initially, a clustered index may be created with a particular threshold level of fullness. For example, the clustered index specified may take into account that the table may be initially 80% full. This allows, for example, 20% of each page to be used in connection with insertions. When a clustered index is rebuilt, 20% of each page is blank If a page is full and there is an insertion, a page break is obtained such that the initial page of data may be divided into two portions spanning two pages, for example, instead of one. The newly added page may not be physically contiguous for that particular LV in accordance with a specified lexicographical attribute ordering.

An embodiment may rebuild the table using the clustered index prior to executing processing steps using the statistics table. In other words, data may be inserted into the statistics table over a period of time. Prior to loading data, for example, in connection with the busy and free disks, the statistics table may be rebuilt using the clustered index. Thus, even if new rows of data are inserted and span to another page on the storage device, rebuilding using the clustered index in accordance with the LV# and timestamp id causes the data for each LV to be stored contiguously by increasing time stamp id.

In connection with the events table, when the maximum or last entry is reached for the fixed allocation of size, row entries of the events table may be reused such that the oldest time stamp is reused first, for example, by reusing entries sequentially. Corresponding rows in the statistics table may be updated accordingly, for example, for each timestamp id. It should be noted that an embodiment may update an entry in the statistics table rather than insert a new entry in accordance with event table information for a particular timestamp. In other words, non-key data fields in each record of the statistics table may be updated in accordance with updates to the events table since these non-key data fields are not part of the clustered index and do not determine the physical location on the storage device. An embodiment may use, for example, a database "update" commands to update non-key fields of the statistics table, with respect to the clustered index, in accordance with changes to fields for each the timestamp id for each LV.

In performing data collection, data may be collected for an "event". This may mean that, for example, data may be collected for all LVs for a particular date and time associated with a timestamp id.

It should also be noted that an embodiment may include any one of a variety of calculations and formulae to be used in connection with determining various quantities that may be used, for example, in connection with performing an optimization. For example, one embodiment uses the equation for determining disk seek time as described in equation (6) U.S. application Ser. No. 09/396,253, pending, as filed on Sep. 19, 1999, for "Load Balancing On Disk Array Storage Device". Statistics on the number of accesses to LVs are collected at periodic time intervals. For each sample time interval, the seek time, $T(\text{seek})_d$, for a given disk drive, d, segregated into N logical volumes, is computed according to:

$$T(\text{seek})_d = \left[ \frac{\sum_{i,j=1}^{N} T_{i,j} * A_i * A_j}{\sum_{k=1}^{N} A_k} \right] \quad \text{EQUATION 9}$$

in which $T_{i,j}$ is the time for the disk head to seek between a given pair, (i, j), of logical volumes on the disk drive, d, wherein $1 \leq i \leq N$, $1 \leq j \leq N$, and $A_i$ and $A_j$ are the respective weighted activities, also known elsewhere herein as the optimizer activity level or LV activity from the sample time wherein the sum of $A_k$ for all values of k, $1 \leq k \leq N$, represents the total number of weighted accesses to the physical disk storage device, d.

A bound on the relative error associated with a calculation, such as produced in connection with EQUATION 9, may be determined as approximating the error of each term. In connection with EQUATION 9, for example, the maximum relative error in the seek time may be approximated as the error of $T(\text{seek})_d \leq 3*0.0269$ in one embodiment. Additionally, one may estimate the impact of using the foregoing techniques in connection with determining a calculation by examining the performance increase or gains with respect to each term. The relative error of the load is bound by the relative error of the reads, writes, and prefetches, for example, with reference to the positive linear combination of terms of EQUATION 4A for LV activity, for example.

Figure 9:
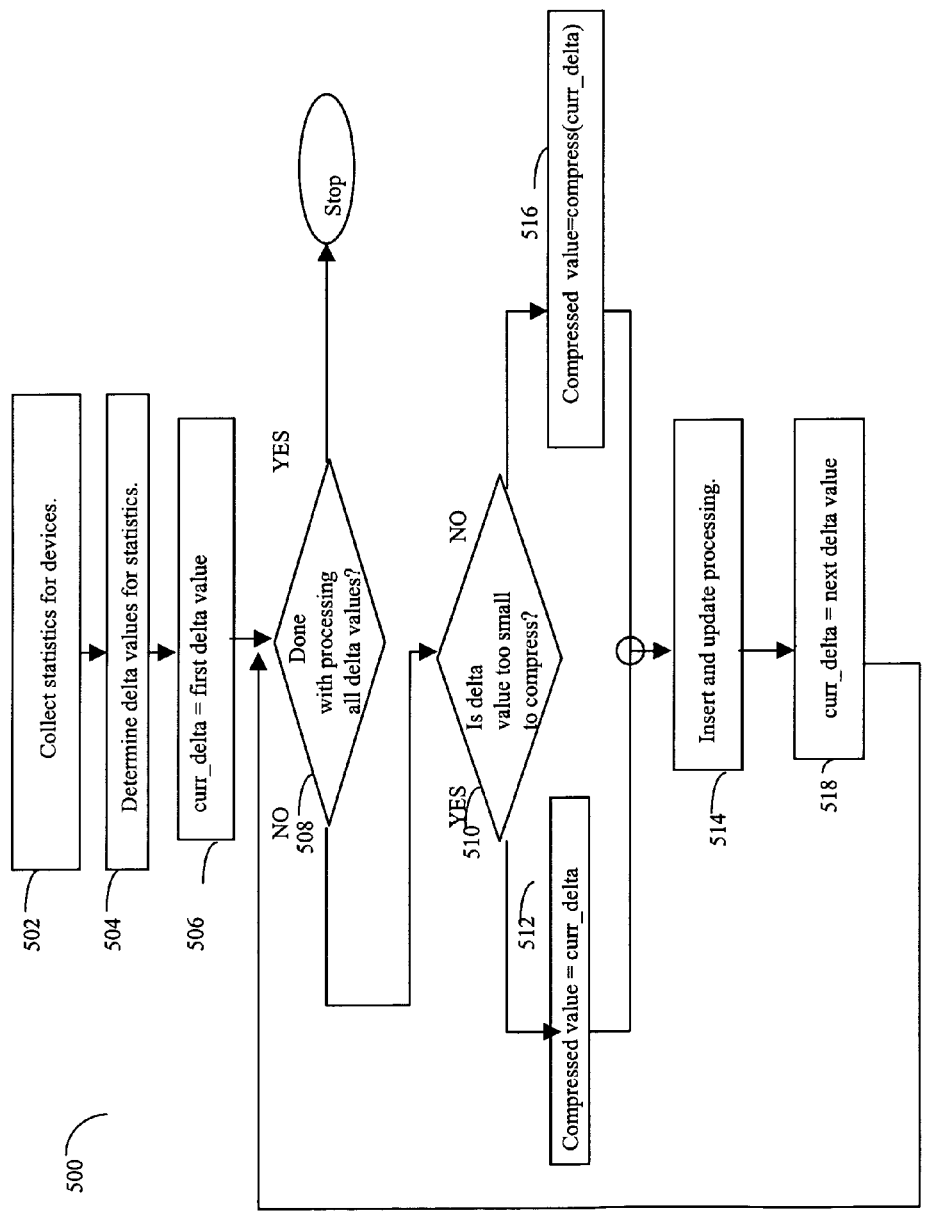
FIG. 9 is flowchart of steps of an embodiment for statistics collection processing.

Referring now to FIG. 9, shown is a flowchart of steps of one embodiment for performing a data collection. At predetermined time intervals, an embodiment may collect statistical information regarding performance of a plurality of devices. At step 502, statistics regarding performance characteristics of devices may be collected. At step 504, delta values for the collected statistics may be determined. At step 506, a loop variable, curr_delta, is assigned the first delta value to be compressed. At step 508, a determination is made as to whether all delta value processing has been performed. If a determination is made that all delta processing is complete, control proceeds to step 518 where the data processing stops. If a determination is made that all delta processing is not complete, control proceeds to step 510 where a determination is made as to whether the current delta value (curr_delta) is too small to compress. If the value is too small to compress, control proceeds to step 512 where the compressed value to be stored is the actual delta value. If the value is not too small, control proceeds to step 516 where the compressed value is determined in accordance with the current delta value, for example, using techniques described herein.

Control proceeds to step 514 where the compressed values are stored in the tables, such as the statistics table. More detailed processing of step 514 is described in connection with FIG. 11. At step 516, the next delta value becomes the current value to be processed on the subsequent loop iteration. Control proceeds to step 508 where the new current delta value is processed until all delta value processing is complete.

At some point, the statistics that may be collected at predetermined time intervals may be used, for example, in connection with performing an optimization, in viewing statistical information such as from a terminal connected to the service processor, and the like. If statistical data is displayed, for example, the statistics may be converted from the physically compressed form to the logical decompressed form using techniques described herein. In connection with performing optimizations, for example, data may also be decompressed and utilized in performing calculations.

Figure 10:
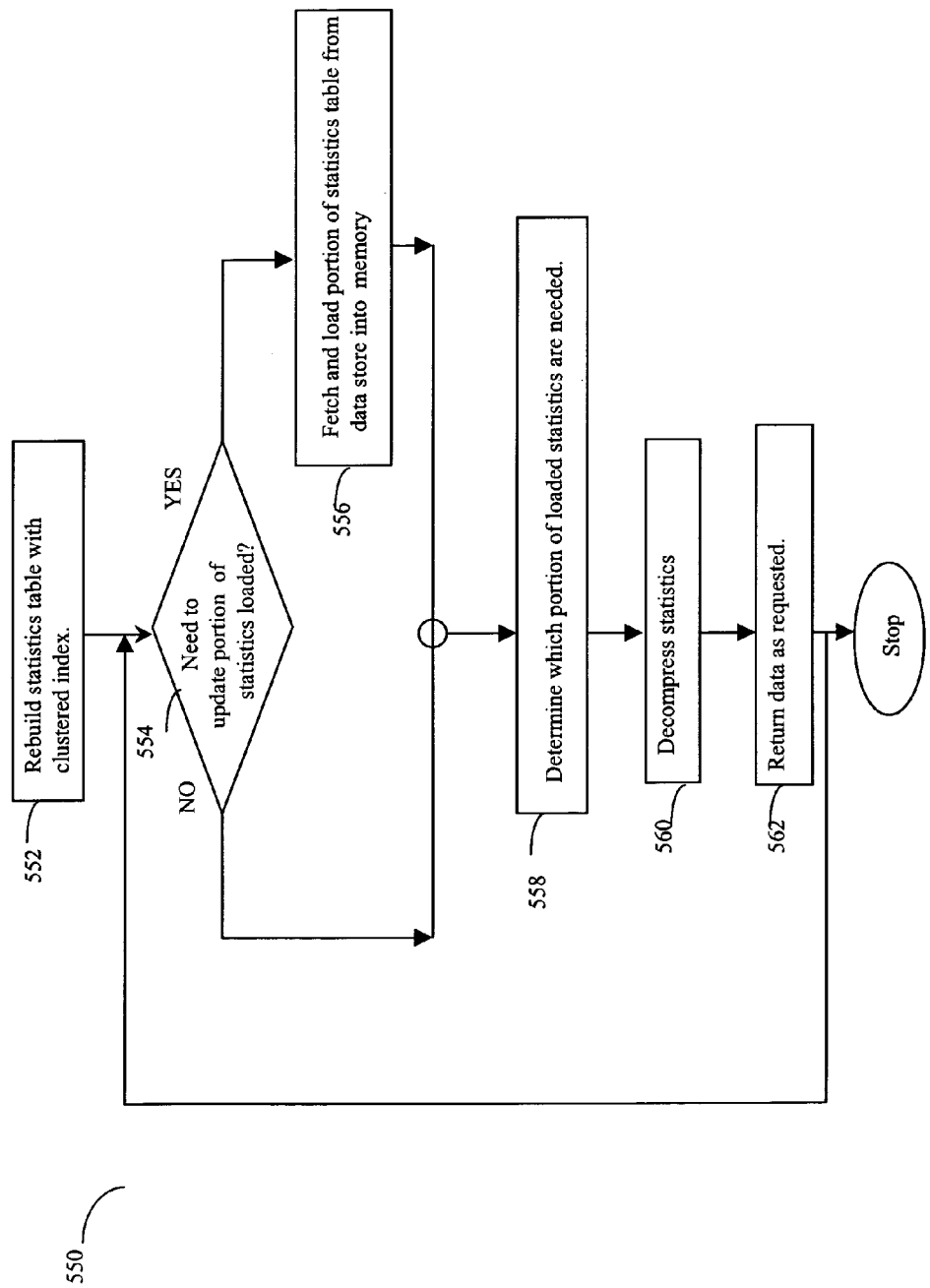
FIG. 10 is a flowchart of steps of an embodiment for processing in connection with the statistics table building and utilization.

Referring now to FIG. 10, shown is a flowchart of steps of one embodiment that may be executed when retrieving statistics, for example, in connection with performing an optimization. At step 552, the clustered index of the statistics table may be rebuilt, for example, prior to performing steps in connection with an optimization. At some time later, a determination may be made, as at step 554, as to whether the portion of loaded statistics needs to be updated. Step 554 may be a determination, for example, as to whether the statistics for the current free and busy device need to updated. If a determination is made that an update to the loaded statistics is needed, control proceeds to step 556 where the additional data is fetched and loaded from the statistics table and brought into memory. Step 556 may be performed, for example, when statistics related to the free disk page need to be updated.

Control proceeds to step 558 where it is determined which portion of the loaded statistics are needed. Step 558 processing may include, for example, only retrieving statistics where the performance time zone bit is 1. At step 560, the statistics are decompressed, for example, using the tables and techniques described herein. At step 562, the data is returned to the requesting process, such as the optimizer. The loop processing steps beginning at step 554 may be performed, for example, as additional data for different devices may be used by the optimizer while performing optimization calculations.

The statistics collection may be a separate process, for example, performed by executing machine instructions to complete processing steps of flowchart 500. Some time later, for example, prior to beginning an optimization, the processing steps of flowchart 550 may be performed.

Figure 11:
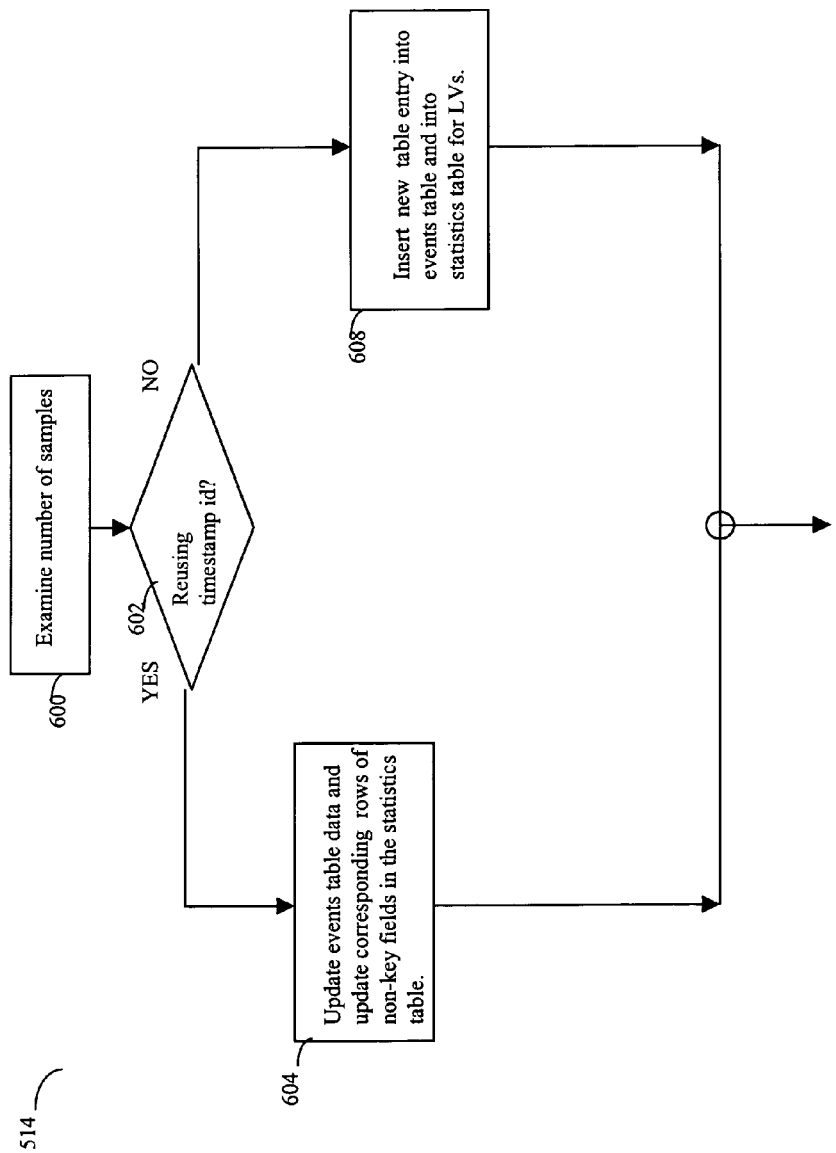
FIG. 11 is a flowchart of more detailed processing steps for inserting and updating processing of tables.

Referring now to FIG. 11, shown are more detailed processing steps in connection with performing insert and update processing. At step 600, the number of samples is determined. In one embodiment, a sample may correspond to a data collection having a particular time stamp and associated time stamp id. At step 602, a determination is made as to whether an entry of the events table for a timestamp id is being reused. If an entry of the events table is being reused such that a time stamp id is being reused, control proceeds to step 604 where the events table is updated. Additionally, for each particular LV having the timestamp id being reused, and other non-key fields in the statistics table may also be updated accordingly.

If a timestamp id is not being reused for a particular LV, control proceeds to step 608 where a new table entry is made in the events table and entries are inserted into the statistics table for that timestamp id, for each LV as appropriate.

It should be noted that an embodiment may also include an additional processing step in connection with inserting an entry into the table. When a particular threshold is reached, an embodiment may automatically perform processing steps in connection with rebuilding the clustered index, for example, of the statistics table.

As described herein with reference to FIG. 2, an embodiment may have one or more data collectors, for example, one or more DAs. One embodiment has all DAs collecting data for their respective associated devices and this data is then placed into a portion of global memory. A process executing in the service processor, for example, such as the optimizer, may access the data as needed as described elsewhere herein in more detail. Additionally, the tables and MSDE database may be located on the service processor. Machine executable instructions may be located and executed by the service processor for managing the tables and the database. Alternatively, an embodiment may locate and/or execute a portion of any one or more of these on a host or other processor in the computer system 10 of FIG. 1.

Additionally, the data collector, paging techniques, and the like described herein may be included as part of an optimizer, for example, as described with reference to FIG. 3. An embodiment may also decouple a portion of the foregoing from the optimizer to provide, for example, these services for use in connection with other processing operations by other components that may be included in the computer system of FIG. 1. Functionality may be utilized by other components by providing an application programming interface (API), or other techniques known to one of ordinary skill in the art.

It should be noted that the foregoing description uses a compression technique that is monotonic and provides for preservation of ordering of compressed values. In other words, if a an original value A is less than another original value B, the compressed value of A is also less than the compressed value of B. Such a property and preservation is important, for example, in that queries may be performed using the compressed values producing the same ordering as may be used in connection with sorting, and the like as if the original values are used.

Described herein is an embodiment using an implementation of an SQL database for storing tables. Other databases and associated organizations may also be included in an embodiment. Additionally, just as clustered indices in this example provide for contiguous storage of tables, other techniques may be used to obtain the same or equivalent results in accordance with functionality that may vary with each embodiment. Additionally, use of the SQL server in this embodiment may provide for centralized remote network management of the statistics included in the database, for example, using TCP/IP and/or modem connections or other types of connections.

The foregoing provides flexible and efficient techniques for storage of data in a compressed form and a decompression technique of the compressed form. The decompression technique produces a decompressed value that approximates the original value within a predetermined relative error threshold to preserve accuracy while providing for increased speed of computation and improved disk utilization. The foregoing uses a compression technique taking advantage of a monotonic property and bounded relative error to preserve reliability and data integrity of the original observed value being compressed and encoded. The range of possible values being compressed are divided up into exponentially growing intervals in which each interval has a lower bound of "m" and an upper bound of M. Decompressed values represent estimates of the observed values within a predetermined error range. The foregoing provides for better use of space while preserving speed and reliability and accuracy of data within a predetermined maximum relative error.

The foregoing also provides techniques for selectively loading a portion of statistics into memory in accordance with what data may be used, for example, in connection with performing optimizations rather than loading all statistical data into memory.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method for storing statistics comprising:
   collecting statistics in connection with performing an operation in a computer system;
   storing said statistics in a statistics table;
   determining at least one device having corresponding statistics in said statistics table in which statistics related to said at least one device are currently being used in processing in connection with optimization being performed by an optimizer; and
   selectively loading into memory, in accordance with said processing in connection with said optimization being performed by said optimizer, only a portion of data from said statistics table, said portion including said corresponding statistics, wherein each occurrence of statistics included in said statistics table is associated with a device volume identifier and a timestamp having a corresponding timestamp identifier, and said each occurrence of statistics is accessed using an index, said index including said timestamp identifier, said timestamp identifier being an integer value in a predetermined range of integer values wherein said range has a size in accordance with a number of occurrences of statistics for said device volume identifier.

2. The method of claim 1, further comprising:
   storing event information in an events table in connection with each occurrence of statistics collected.

3. The method of claim 2, wherein said events table and said statistics table use a common timestamp identifier to identify a particular occurrence of statistics collected.

4. The method of claim 3, wherein said timestamp identifier is an integer used as an index into said events table to obtain additional information about said particular occurrence.

5. The method of claim 4, wherein said additional information includes at least one of: date information, time information, and a bit value indicating whether a corresponding data collection is loaded.

6. The method of claim 5, wherein said bit value is used in determining said portion loaded into memory.

7. The method of claim 5, wherein said bit value is set to indicate statistics associated with a predefined time of day.

8. The method of claim 1, including a first device having a higher activity level than a second device, and the method further includes:
   loading into said memory only statistics associated with said first and second devices while performing processing in connection with optimization.

9. The method of claim 7, further comprising:
updating said statistics included in said memory associated with said second device with other statistics associated with a third device having a lower activity level than said first device.

10. The method of claim 1, wherein said index is a clustered index, and the method further comprising:
building said statistics table prior to performing optimization using said clustered index to provide for physical continuity of storing rows of said statistics table on a particular storage device according to a logical ordering.

11. The method of claim 10, further comprising:
rebuilding said clustered index for said statistics table such that each page of storage has a predetermined amount of unoccupied space.

12. The method of claim 10, wherein said device volume identifier is a logical volume of a device, said index is a clustered index, and said clustered index includes said logical volume of a device and said timestamp identifier.

13. The method of claim 1, wherein said loading is performed without using automatic virtual memory management.

14. A computer system comprising:
a data storage system;
a data collector that collects statistics about said data storage system;
a database that includes said statistics;
an optimizer that performs optimizations in accordance with said statistics;
code that loads only a selective portion of said statistics from said database in accordance with a current operation being performed by said optimizer; and
a memory into which only said selective portion of said statistics is loaded from said database in accordance with said current operation being performed by said optimizer, wherein each occurrence of statistics included in said database is associated with a volume identifier and a timestamp having a corresponding timestamp identifier, and said each occurrence of statistics is accessed using an index, said index including said timestamp identifier, said timestamp identifier being an integer value in a predetermined range of integer values wherein said range has a size in accordance with a number of occurrences of statistics for said volume identifier.

15. The computer system of claim 14, wherein said database includes events information about each occurrence of a statistics collection.

16. The computer system of claim 15, wherein said events information is included in an events table and said statistics are included in a statistics table having data organized by volume in each device of said data storage system, said data included in said statistics table being stored contiguously in said database.

17. The computer system of claim 16, wherein said selective portion is determined using a bit value included in said events table indicating whether a particular set of statistics is of interest.

18. The computer system of claim 17, wherein said timestamp identifier is used to index into said events table, said statistics table associating said timestamp identifier with a corresponding data collection represented in said statistics table.

19. The computer system of claim 18, wherein said index is a clustered index and said statistics table is indexed using said clustered index comprising said volume identifier and said time stamp identifier, said clustered index being used in storing said data that is included in said statistics table contiguously.

20. The computer system of claim 19, wherein said statistics table is organized in accordance with said volume identifier, and further by time stamp identifier for each of said volume identifiers.

21. The computer system of claim 14, wherein said optimizer is a data storage optimizer for optimizing performance of devices in said computer system, and the computer system further includes:
a database optimizer that automatically performs selective data retrieval in accordance with specified criteria.

22. The computer system of claim 21, wherein said database optimizer further comprises machine executable code that:
performs clustered indexing;
optimally selects a database joining strategy for selectively loading only selected portions of said statistics from a statistics table in accordance with at least one data value included in another table.

23. The computer system of claim 22, wherein said database optimizer further comprises machine executable code that:
selects only those rows of data from said statistics table for particular devices in accordance with a bit value specified in said other table.

24. The computer system of claim 23, wherein said bit value is set to indicate statistics associated with a predefined time of day.

25. The computer system of claim 22, wherein said database optimizer is included in an SQL server.

26. The computer system of claim 22, wherein said volume identifier is a logical volume of a device and said clustered indexing uses a clustered index including said logical volume of a device and said timestamp identifier.

27. A computer program product, stored in a computer-readable medium for storing statistics, comprising machine executable code to perform:
collecting statistics in connection with performing an operation in a computer system; storing said statistics in a statistics table;
determining at least one device having corresponding statistics in said statistics table in which statistics related to said at least one device are currently being used in processing in connection with optimization being performed by an optimizer; and
selectively loading into memory, in accordance with said processing in connection with said optimization being performed by said optimizer, only a portion of data from said statistics table, said portion including said corresponding statistics, wherein each occurrence of statistics included in said statistics table is associated with a device volume identifier and a timestamp having a corresponding timestamp identifier, and said each occurrence of statistics is accessed using an index, said index including said timestamp identifier, said timestamp identifier being an integer value in a predetermined range of integer values wherein said range has a size in accordance with a number of occurrences of statistics for said device volume identifier.

28. The computer program product of claim 27, further comprising machine executable code to perform:
storing event information in an events table in connection with each occurrence of statistics collected.

29. The computer program product of claim 28, wherein said events table and said statistics table use a common timestamp identifier to identify a particular occurrence of statistics collected.

30. The computer program product of claim 29, wherein said timestamp identifier is an integer used as an index into said events table to obtain additional information about said particular occurrence.

31. The computer program product of claim 30, wherein said additional information includes at least one of: date information, time information, and a bit value indicating whether a corresponding data collection is loaded.

32. The computer program product of claim 31, wherein said bit value is used in determining said portion loaded into memory.

33. The computer program product of claim 31, wherein said bit value is set to indicate statistics associated with a predefined time of day.

34. The computer program product of claim 27, wherein a first device has a higher activity level than a second device, and the computer program product further includes machine executable code to perform:
    loading into said memory only statistics associated with said first and second devices while performing processing in connection with an optimization.

35. The computer program product of claim 34, further comprising machine executable code to perform:
    updating said statistics included in said memory associated with said second device with other statistics associated with a third device having an activity level lower than said first device.

36. The computer program product of claim 27, wherein said index is a clustered index and the computer program product further comprising machine executable code to perform:
    building said statistics table prior to performing optimization using said clustered index to provide for physical continuity of storing rows of said statistics table on a particular storage device according to a logical ordering.

37. The computer program product of claim 36, further comprising machine executable code to perform:
    rebuilding said clustered index for said statistics table such that each page of storage has a predetermined amount of unoccupied space.

38. The computer program product of claim 36, wherein said device volume identifier is a logical volume of a device, said index is a clustered index, and said clustered index includes said logical volume of a device and said timestamp identifier.

39. The computer program product of claim 27, wherein said loading is performed without using automatic virtual memory management.

40. A method for storing statistics comprising:
    receiving a table of statistics stored in a database, said table being constructed using a clustered index including a logical volume of a device and a timestamp identifier, said logical volume and said timestamp identifier being associated with statistics included in said table, said timestamp identifier being an integer value in a predetermined range of integer values wherein said integer value is mapped to a corresponding timestamp identifying a particular occurrence of statistics collected and stored in said table, said predetermined range having a size in accordance with a number of occurrences of statistics included in said table for a logical volume, said clustered index providing for physical continuity of storing rows included in said table on a storage device; and
    selectively retrieving a portion of said statistics associated with said logical volume when performing operations upon statistics for said logical volume, wherein said operations are performed in connection with an optimizer performing optimization.

41. A computer program product, stored in a computer-readable medium for storing statistics, comprising code to perform optimization operation that:
    receives a table of statistics stored in a database, said table being constructed using a clustered index including a logical volume of a device and a timestamp identifier, said logical volume and said timestamp identifier being associated with statistics included in said table, said timestamp identifier being an integer value in a predetermined range of integer values wherein said integer value is mapped to a corresponding timestamp identifying a particular occurrence of statistics collected and stored in said table, said predetermined range having a size in accordance with a number of occurrences of statistics included in said table for a logical volume, said clustered index providing for physical continuity of storing rows included in said table on a storage device; and
    selectively retrieves a portion of said statistics associated with said logical volume when performing operations upon statistics for said logical volume, wherein said operations are performed in connection with an optimizer performing optimization.

* * * * *